United States Patent
Lee et al.

(10) Patent No.: US 8,519,519 B2
(45) Date of Patent: Aug. 27, 2013

(54) SEMICONDUCTOR DEVICE HAVING DIE PADS ISOLATED FROM INTERCONNECT PORTION AND METHOD OF ASSEMBLING SAME

(75) Inventors: Beng Siong Lee, Ampang (MY); Guat Kew Teh, Subang Jaya (MY); Wai Keong Wong, Shah Alam (MY)

(73) Assignee: Freescale Semiconductor Inc., Austin, TX (US)

(*) Notice: Subject to any disclaimer, the term of this patent is extended or adjusted under 35 U.S.C. 154(b) by 207 days.

(21) Appl. No.: 12/938,376

(22) Filed: Nov. 3, 2010

(65) Prior Publication Data

US 2012/0104583 A1    May 3, 2012

(51) Int. Cl.
*H01L 23/28* (2006.01)

(52) U.S. Cl.
USPC ........... 257/676; 257/666; 257/723; 257/787; 257/E23.052; 257/E23.124; 438/612; 438/666

(58) Field of Classification Search
USPC ............. 257/522, 671, 709, 725, 735, 790, 257/E23.049, E23.123, E23.052, E23.124, 257/676, 787, 666, 723; 438/612, 666
See application file for complete search history.

(56) References Cited

U.S. PATENT DOCUMENTS

| | | | |
|---|---|---|---|
| 5,328,079 A | 7/1994 | Mathew | |
| 5,468,999 A | 11/1995 | Lin | |
| 5,639,990 A * | 6/1997 | Nishihara et al. | 174/527 |
| 5,723,906 A | 3/1998 | Rush | |
| 6,545,332 B2 * | 4/2003 | Huang | 257/433 |
| 6,677,672 B2 * | 1/2004 | Knapp et al. | 257/687 |
| 6,759,753 B2 * | 7/2004 | Chao | 257/787 |
| 6,927,480 B2 * | 8/2005 | Lee et al. | 257/666 |
| 7,014,888 B2 | 3/2006 | Mcdonald | |
| 7,208,826 B2 * | 4/2007 | Sakamoto et al. | 257/687 |
| 7,358,599 B2 * | 4/2008 | Ohe et al. | 257/678 |
| 7,476,972 B2 * | 1/2009 | Takahashi | 257/773 |
| 7,759,806 B2 * | 7/2010 | Tay et al. | 257/787 |
| 7,800,225 B2 * | 9/2010 | Choi | 257/737 |
| 8,163,604 B2 * | 4/2012 | Ong et al. | 438/123 |
| 2002/0031856 A1 * | 3/2002 | Lee et al. | 438/106 |
| 2006/0053895 A1 | 3/2006 | Kandler | |

* cited by examiner

*Primary Examiner* — John C Ingham
(74) *Attorney, Agent, or Firm* — Charles Beigere (57) ABSTRACT

A semiconductor device includes a lead frame that has a die interconnect portion and at least first and second die pads. The die interconnect portion is isolated from the die pads. The device also includes a first die and a second die attached to the first and second die pads and electrically connected to each other by way of the die interconnect portion. The first die is encapsulated in a first medium and the second die is encapsulated in a second medium, the first medium being different from the second medium.

9 Claims, 5 Drawing Sheets

SEMICONDUCTOR DEVICE HAVING DIE PADS ISOLATED FROM INTERCONNECT PORTION AND METHOD OF ASSEMBLING SAME

BACKGROUND OF THE INVENTION

The present invention relates to semiconductor packaging, and more particularly, to forming electrical connections in multi-die packages where the dies are disposed within different media.

Quality is a very important factor in the automated manufacturing of products, such as semiconductor packages. Faulty semiconductor packages having defects, particularly defects in wire bonds of the packages, are responsible for a significant number of customer returns. One cause of such defects is broken bond wires and/or broken wire bonds. Such defects can occur during, for example, quality assurance testing of the semiconductor packages, such as reliability stress testing. Obviously, a high incidence of failures is undesirable. Even less desirable is a situation whereby a given semiconductor package passes internal quality checks only to fail after being shipped to a customer.

Figure 1:
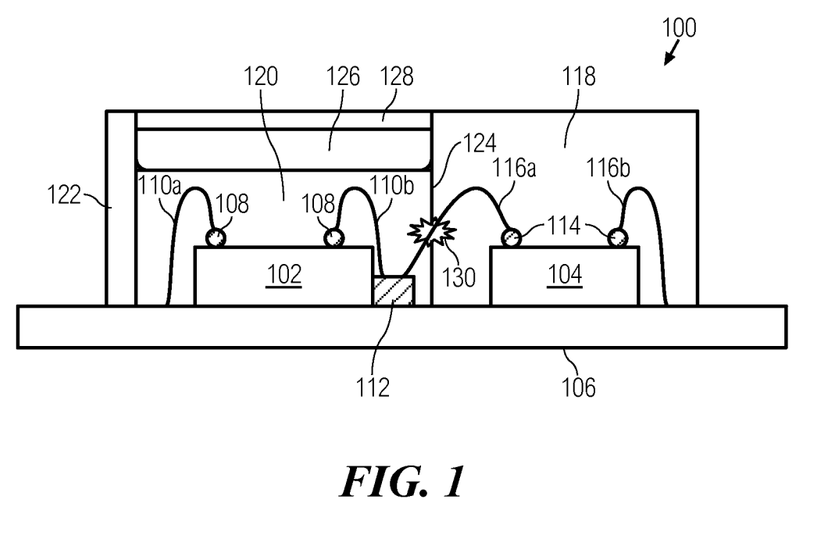
FIG. 1 is a sectional view of a typical semiconductor package having first and second dies encapsulated in different encapsulation media.

There are several known issues with wire bond failures in semiconductor packages requiring die to die interconnections through wire bonding. Referring to FIG. 1, a first type of known failure is illustrated. A conventional semiconductor device 100 includes a first die 102 and a second die 104, both of which are disposed upon die pads of a lead frame 106. The first die 102 has stud bumps 108 that form termination points on the die 102 for bond wires 110a, 110b. A first bond wire 110a is connected directly to the lead frame 106 and a second bond wire 110b is connected to a lead finger or bond pad 112 of the lead frame 106.

Likewise, the second die 104 has first and second stud bumps 114 that form termination points for first and second bond wires 116a, 116b from the second die 104. The first bond wire 116a is also connected to the lead finger or bond pad 112, while the second bond wire 116b is connected directly to the lead frame 106. The bond wires 110b and 116a effect an electrical connection between the first and second dies 102, 104 by way of the lead finger or bond pad 112.

The second die 104 is encapsulated within a mould compound 118, such as a thermosetting resin typically used in a semiconductor mould encapsulation process. The first die 102 is encapsulated within an encapsulation gel 120, also typically used in semiconductor manufacturing processes. The encapsulation gel 120 is constrained between a package wall 122 and the mould compound 118. A boundary 124 is formed where the mould compound 118 meets with and constrains the encapsulation gel 120. A void 126 is provided for thermal expansion and movement of the encapsulation gel 120. A mould cap or lid 128 is provided to avoid any leakage or spillage of the encapsulation gel 120.

A significant problem with an arrangement such as that of FIG. 1 is that in the region marked 130 the bond wire 116a is exposed to thermal stresses caused by the transition from one encapsulation medium to the other. More specifically, the stresses may be caused due to the fact that each of the encapsulation media has a different coefficient of thermal expansion (CTE), meaning that in instances where the semiconductor device 100 is subjected to heating, each of the encapsulation media 118, 120 expands at a different rate. As will be appreciated, such CTE mismatches may have a detrimental effect on the bond wire 116a, and cause damage thereto, such as breakage in the region 130. In turn, this can lead to device failure, a highly undesirable situation for numerous reasons.

The semiconductor device 100 may be one that is used in, for example, a PDA or a smart phone. In such applications, the second die 104 is a microcontroller (MCU) and the first die 102 is a sensor such as a pressure cell or gravity cell used in many applications in PDAs/smart phones. It is necessary to provide the sensor within a gel 120 because, depending on the precise application and nature of the sensor, pressure on, or movement of, the sensor is necessary for its detecting function. It is generally not possible for these types of sensors to be encapsulated with the mould compound 118 as the mould compound 118 is typically cured or set. Use of encapsulation gel itself is not without its problems, as will now be discussed with reference to FIGS. 2 and 3.

Figure 2:
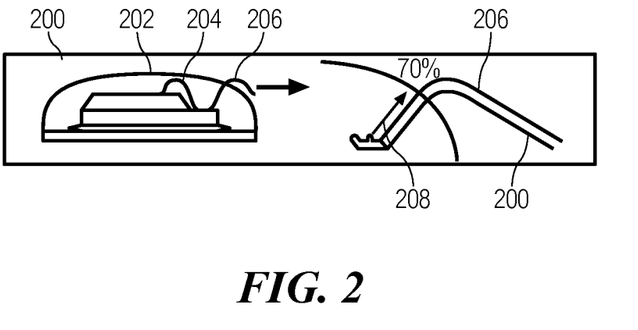
FIG. 2 is an elevational view of a semiconductor die disposed within gel encapsulation and an enlarged view of the relative sizes of the gel encapsulation and the wire bonds in the package.

FIG. 2 illustrates a semiconductor package 200 disposed within encapsulation gel 202. A bond wire 204 is formed in the package 200 from the die to either of a bond pad or a lead frame and a second bond wire 206 is formed for connection to another die (not shown in FIG. 2). Typically in such installations, it is necessary for the gel 202 to cover 70% or more of the height of the bond wire 206 as indicated by arrow 208. The control of coverage is determined by the configuration of the package/die and this causes difficulties in controlling the packaging process. If there is too much or too little of the gel 202, a stress mismatch is created that may leads to broken wires in this area.

Figure 3:
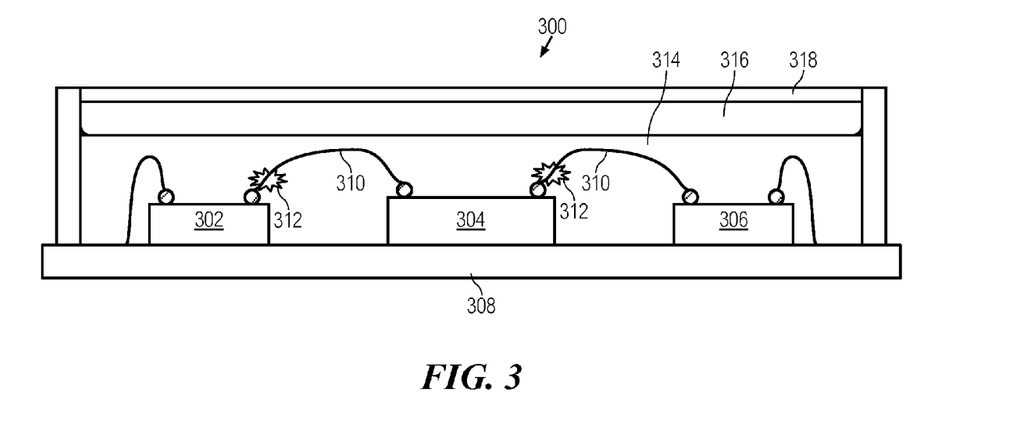
FIG. 3 is a sectional view of a typical semiconductor package requiring die to die interconnection in a mould cavity filled with encapsulation gel.

Referring now to FIG. 3, a second type of known failure in a device having a die to die interconnection will now be discussed. A conventional semiconductor device 300 has first, second and third dies 302, 304, 306, all of which are disposed upon a lead frame 308. Die to die interconnections are formed between the first die 302 and the second die 304 and also between the second die 304 and the third die 306 with bond wires 310. The dies 302, 304, 306 and the bond wires 310 are encapsulated by encapsulation gel 314 filled in the mould to a level allowing an expansion void 316 between an upper surface of the encapsulation gel 314 and a mould lid 318.

Typically successful formation of such die to die interconnections presents challenges and is generally considered to be amongst the more complex of wire bonding techniques, requiring relatively delicate processes such as bond over pad or ball stitch on ball (BSOB) bonding. The formation of the wire bond connection on the second die requires great care otherwise the wiring traces at the second termination point on the die can be damaged. Additionally, arrangements typified by the example of FIG. 3 require large volumes of the gel 310. An undesirable side-effect of this is that it has been found that a larger volume of gel can lead to higher stresses on the bond wires 310 thereby leading to high failure rates of the bond wires 310, including breakages at regions 312. Furthermore, a CTE mismatch also arises between the bond wires 310 themselves and the gel 314 which, in turn, also causes further stresses on the wires 310.

Thus, it would be advantageous to be able to assemble a semiconductor device that is less susceptible to failures caused by encapsulation material CTE mismatches.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

FIG. 6b illustrates an elevational view of the lead frame of FIG. 6a; and

FIG. 6c illustrates an underside view of the lead frame of FIG. 6a.

DETAILED DESCRIPTION OF THE INVENTION

In one embodiment, the present invention provides a semiconductor package device including a lead frame having a die interconnect portion and first and second die pads. The first and second die pads are isolated from the die interconnect portion. A first die is attached to a first major surface of the first die pad, and a second die is attached to a first major surface of the second die pad. Electrical connections between the first die and the die interconnect portion and between the second die and the die interconnect portion electrically connect the first and second dies. A first medium is used to encapsulate the first die and a second medium different from the first medium encapsulates the second die. Such an arrangement obviates the requirement for complex die to die interconnection techniques such as bond over pad and ball stitch on ball techniques, and provides several other benefits that are further discussed below.

In another embodiment, the present invention provides a lead frame that can be used for assembling a semiconductor device. The lead frame includes a die interconnect portion a first die pad having a first major surface upon which a first die may be attached, and a second die pad having a first major surface upon which a second die may be attached. The die interconnect portion is isolated from the first and second die pads, and is arranged to receive a first bond wire from the first die and a second bond wire from the second die. The lead frame facilitates an inter-die bond and obviates the need for complex die to die interconnections.

In another embodiment, the present invention provides a method of assembling a semiconductor device that includes providing a lead frame having a die interconnect portion and first and second die pads, the die interconnect portion being isolated from the first and second die pads; attaching a first die on a first major surface of the first die pad, and attaching a second die on a first major surface of the second die pad. The first die is electrically connected with the die interconnect portion with a first bond wire and the second die is electrically connected with the die interconnect portion with a second bond wire, thereby electrically connecting the first and second dies. The first die and the first die pad are disposed within a first medium, and the second die and the second die pad are disposed within a second medium that is different from the first medium.

In yet another embodiment, the present invention provides a method of forming a lead frame that can be used for assembling a semiconductor device. The method includes forming a die interconnect portion of the lead frame and first and second die pads, wherein the die interconnect portion is isolated from the first and second die pads. The first die pad has a first major surface upon which a first die may be attached, and the second die pad has a first major surface upon which a second die may be attached. The arrangement is such that the die interconnect portion can receive a first bond wire from the first die and a second bond wire from the second die such that the die interconnect portion thereby forms an electrical connection between the first and second dies.

Implementation of the techniques disclosed herein may provide multiple significant benefits. For instance, use of the die interconnect portion on the lead frame obviates the requirement to have complex die to die interconnection wire bonds such as bond over pad, and ball stitch on bond connections. Use of the techniques disclosed herein allows for die to die interconnections using bond wires and standard wire bonding techniques, such a ball bonding and wedge bonding.

The die interconnect portion may be obtained from a standard lead frame with minimal additional machining. Thus, a relatively simple structural change to a conventional lead frame package provides significant advantages.

Further, the removal of the requirement that the wire bond crosses an encapsulation media boundary (the boundary between the two different encapsulation media) results in less wire bond breakages due to additional stresses, including stresses caused from any CTE mismatch between the respective encapsulation media.

An additional advantage provided by the present invention is a reduction in the amount of gel material required to encapsulate a sensor die, which results in reduce stress on the bond wires caused by CTE mismatch between the bond wires and the gel material. A reduction in the amount of gel material itself also reduces the stress on the bond wires.

The invention has particular application in any package that has multi-encapsulation media, including mould compound, gel material and no encapsulation material (e.g., air and mould compound or air and gel material. Further, the invention may be utilized in semiconductor packages such as SOIC, BGA, QFP, QFN etc.

The terms "a" or "an," as used herein, are defined as one or more than one. The use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to distinguish between the elements such terms describe and not necessarily to indicate temporal or other prioritization of such elements.

Because implementation of techniques in accordance with the present invention is, at least in part, composed of techniques known to those skilled in the art, some details will not be explained in any greater extent than that considered necessary for the understanding and appreciation of the underlying concepts of the present invention and in order not to obfuscate or distract from the teachings of the present invention.

Figure 4A:
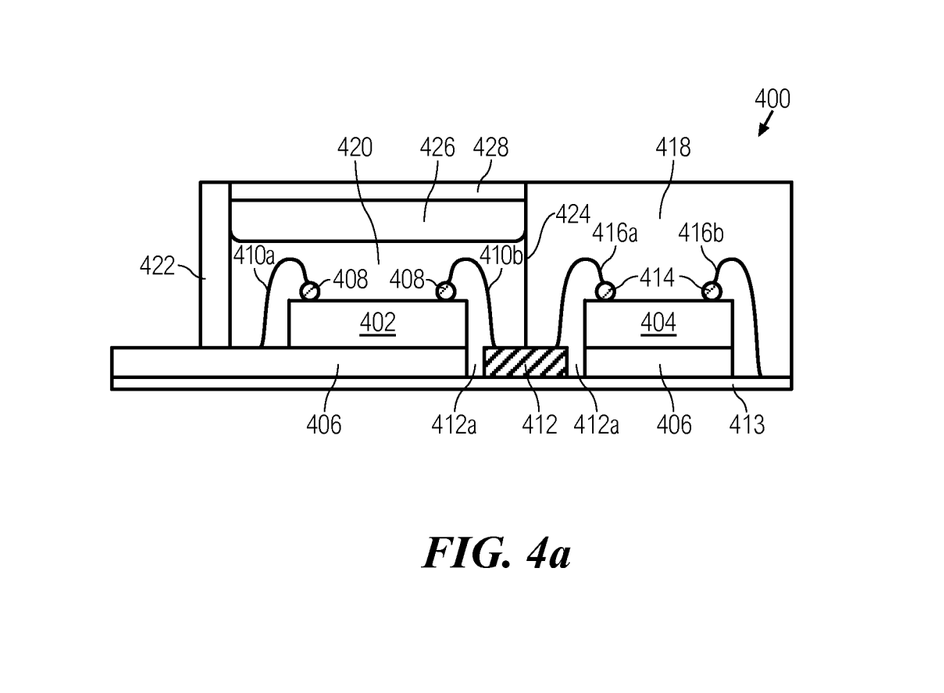
FIG. 4a is a sectional view of a semiconductor package in accordance with an embodiment of the present invention.
Figure 4B:
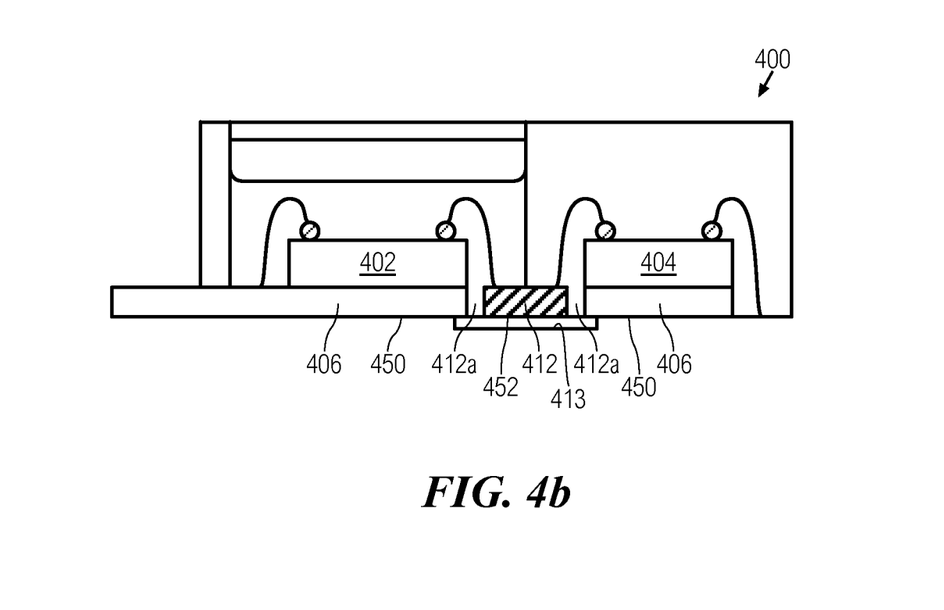
FIG. 4b is a sectional view of a semiconductor package in accordance with another embodiment of the present invention.

Some of the embodiments may be implemented using a variety of different wire bonding techniques and encapsulation media. For example, although FIG. 4 and the discussion thereof provides a description of sensor dies disposed within mould compound and encapsulation gel, it will be appreciated that other encapsulation media may also be used, or not at all. That is, one of the dies may be provided without encapsulation. This exemplary semiconductor package is presented to provide a useful reference in discussing various aspects of the invention. Those skilled in the art will recognize that alternative embodiments may use different or no encapsulation media. Those skilled in the art also will recognize that the order of operations may be altered in various other embodiments.

Referring now to FIG. 4a, a first embodiment of the present invention will be described. A semiconductor device 400 includes a first die 402 and a second die 404. The first die 402 is attached to a first major surface of a first die pad of a lead frame 406, and the second die 404 is attached to a first major surface of a second die pad of the lead frame 406. The first die 402 has first and second bumps 408, each of which forms a termination point for bond wires 410a, 410b. That is, the bond wires 410a and 410b are connected to the first die 402 using a ball bonding process where balls are formed during the electronic flame off on the die bond pads when individual wires are attached to the die bond pads, which is well known in the art. The other end of the first bond wire 410a is connected to a lead finger of the lead frame 406, for instance using a wedge bonding technique, while the second bond wire 410b is connected to a die interconnect portion 412 of the lead frame 406, also using, for example, a wedge bonding technique. The die interconnect portion 412 preferably is isolated from the first and second die pad. The die interconnect portion 412 is isolated from the first and second die pads with isolation gaps 412a. Additional techniques for isolating the die interconnect portion 412 from the die pads are discussed with reference to FIG. 6. The lead frame 406, which includes the die interconnect portion 412 and the first and second die pads, is disposed on an insulation layer 413.

Similar to the first die 402, the second die 404 also has first and second stud ball bumps 414, which illustrate just one way of attaching third and fourth bond wires 416a, 416b to the second die 404 (e.g., the third and fourth bond wires 416a, 416b are attached to pads on the second die 404 using a ball bonding technique). The third bond wire 416a also is connected to the die interconnect portion 412, while the fourth bond wire 416b is connected to a lead finger of the lead frame 406. Thus, the die interconnect portion 412 provides for electrical connection of the first and second dies 402 and 404 by way of the wires 410b and 416a. That is, according to the present invention, die to die interconnection is effected through the die interconnect portion 412.

In the embodiment shown in FIG. 4a, the first die 402 is disposed within or encapsulated with a first medium 420 and the second die 404 is disposed within or encapsulated with a second medium 418, where the first medium 420 is different from the second medium 418. Further, as can be seen in the drawing, the first and second media 420 and 418 interface with each other at the die interconnect portion 412. More particularly, the second bond wire 410b is disposed entirely within the first encapsulation medium 420 and the third bond wire 416a is disposed entirely within the second encapsulation medium 418.

In the embodiment of FIG. 4a, the second medium 418 used to encapsulate the second die 404 is a mould compound 418, such as a thermosetting resin as is typically used in a semiconductor packaging. The first medium 420 used to encapsulate the first die 402 is a gel material, also typically used in semiconductor manufacturing processes to encapsulate sensor type dies.

The gel encapsulation material is constrained in the semiconductor package between a package wall 422 and the mould compound 418. A boundary 424 is formed where the mould compound 418 meets with and constrains the gel material 420. A void 426 is provided for thermal expansion and movement of the gel material 420. A mould lid or cap 428 is provided to avoid any leakage/spillage of the gel material 420.

Implementation of the techniques of FIG. 4a allow for die to die bonding where there are two different encapsulation media with different coefficients of thermal expansion and to minimize possible instances of breakages of the bond wires caused by the wire having to cross the encapsulation media boundary 424. This benefit may be realized by virtue of the fact that each respective bond wire 410a and 416a is contained within their respective media 420, 418 and the die interconnect portion 412 is provided to bridge the encapsulation media boundary 424 thereby obviating the requirement for either of the wires or a single wire to cross the boundary.

FIG. 4b illustrates a second embodiment of the invention in which a semiconductor device, also referred to by reference numeral 400, is illustrated. The arrangement of FIG. 4b is similar to the arrangement of the embodiment of FIG. 4a and, therefore, a full discussion of the features common to FIG. 4a and FIG. 4b is not repeated. However, the principal components of the semiconductor device 400 of FIG. 4b are the first die 402 attached to a first major surface of a first die pad of the lead frame 406, a second die 404 attached to a first major surface of a second die pad of the lead frame 406 and a die interconnect portion 412 of the lead frame 406 that is isolated from the first and second die pads. Isolation is provided with the isolation gaps 412a. Where the arrangement of FIG. 4b differs from that of FIG. 4a is in the provision of the insulation layer 413. In the embodiment of FIG. 4b, the insulation layer 413 is a layer of insulative tape affixed to the respective undersides 450 of the first and second die pads and underside 452 of the die interconnect portion 412. In embodiments of the invention, the insulative tape is a tape of a type that is certified for use in semiconductor packaging processes. For instance, it contains permissible levels of impurities so that it does not interfere with the product characteristics/functions. Further, the tape provides enough of an adhering function to hold the die interconnect portion 412 under typical process conditions.

Figure 5A:
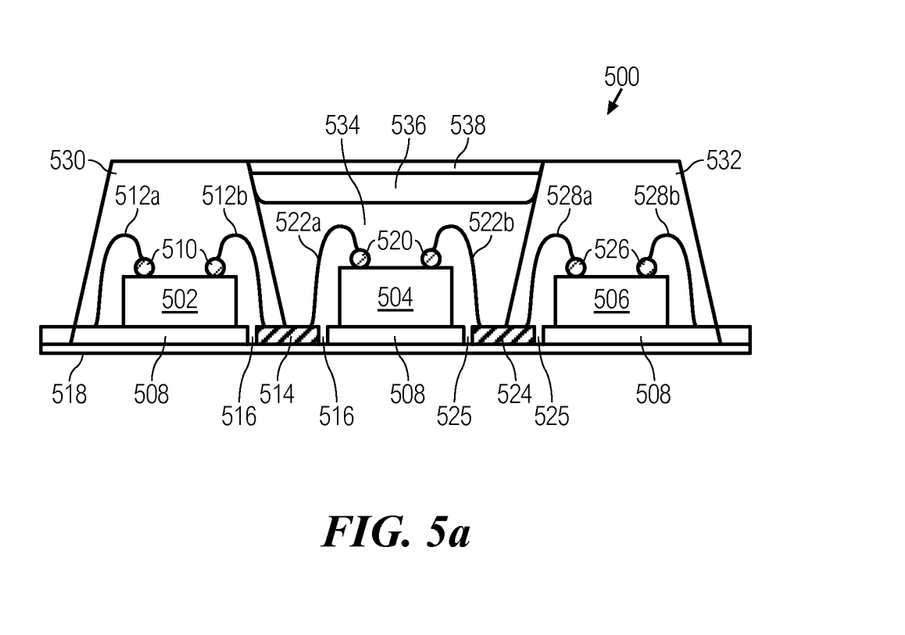
FIG. 5a is a sectional view of a semiconductor package in accordance with another embodiment of the present invention.

Implementation of the techniques embodied in the examples of FIG. 4a and FIG. 4b may also be adapted for the variant of FIG. 5, a discussion of which now follows. Referring then to FIG. 5a, a semiconductor device 500 includes first, second and third dies 502, 504 and 506. Each of the dies 502, 504, 506 is attached to respective first major surfaces of one or more die pads of a lead frame 508 in a manner similar to that of FIG. 4. Although the lead frame 508 is referred to as a single lead frame, it will be understood by those of skill in the art that the lead frame 508 may comprise one or more lead frames. The first die 502 has first and second stud ball bumps 510, each of which forms a termination point for bond wires 512a, 512b (illustrating ball bonds). The other end of the first bond wire 512a is connected to a lead finger of the lead frame 508 and the second bond wire 512b is connected to a first die interconnect portion 514 of the lead frame 508 that has been isolated from the die pads of the lead frame 508. The die interconnect portion 514 is isolated from the die pads with isolation gaps 516. Techniques for the formation of the isolation gaps (or isolation portions) are described with reference to FIG. 6. The lead frame 508, including the first, second and third die pads and the first and second die interconnect portions 514, 524 is disposed on an insulation layer 518.

Similar to the first die 502, the second die 504 also has first and second stud ball bumps 520, each of which forms a termination point for first and second bond wires 522a, 522b that are attached to the second die 504. The first bond wire 522a is connected to the first die interconnect portion 514 and the second bond wire 522b is connected to a second die interconnect portion 524, which also is isolated from the die pads of the lead frame 508 with isolation gaps 525. The second die interconnect portion 524 is also disposed on the insulation layer 518.

The third die 506 also has first and second stud ball bumps 526, each of which forms a termination point for first and second bond wires 528a, 528b that are attached to the third die 506. The first bond wire 528a is connected to the second die interconnect portion 524 and the second bond wire 528b is connected to a lead finger of the lead frame 508. In the embodiment of FIG. 5a, the first die interconnect portion 514 provides for an electrical connection between the bond wires 512b and 522a. Thus, die to die electrical interconnection between the first and second dies 502 and 504 is effected through the first die interconnect portion 514. Similarly, die to die electrical interconnection between second and third dies 504 and 506 is effected through the second die interconnect portion 524.

In the embodiment of FIG. 5a, the first die 502 and the bond wires 512a, 512b are encapsulated with a first encapsulation medium 530, the second die 504 and the bond wires 522a, 522b are encapsulated with a second encapsulation medium 534 that is different from the first encapsulation medium 530, and the third die 506 and bond wires 528a, 528b are encapsulated with a third encapsulation medium 532 that is different from the second encapsulation medium 534. In one embodiment of the invention, the first and third dies 502, 506 are integrated circuits and the second die 504 is a sensor circuit, such as a pressure sensor or accelerometer, and the first and third encapsulation mediums 530, 532 comprise a mould compound (e.g., epoxy resin) and the second encapsulation medium 534 comprises a gel material as is typically used to protect sensor circuits. The semiconductor device 500 may also include a void 536 and a lid 538 that are similar to the void 426 and lid 428 of the semiconductor device 400 of FIG. 4a.

Like the embodiments shown in FIGS. 4a and 4b, none of the bond wires cross any of the boundaries between the encapsulation mediums, so none of the bond wires individually is subjected to more than one CTE because of the use of the first and second die interconnect portions 514 and 524.

Thus, in essence, FIG. 5a illustrates a semiconductor device 500 having a lead frame with two die interconnect portions 514, 524 and first, second and third dies 502, 504, and 506 attached to die pads of the lead frame 508, where the die interconnect portions 512, 524 are isolated from the die pads. Die to die electrical interconnection between the second die 504 and each of the first and third dies 502, 506 is effected through bond wires from the second die 504 to the first die 502 by way of the first die interconnect portion 514 and from the second die 504 to the third die 506 by way of the second die interconnect portion 524.

Figure 5B:
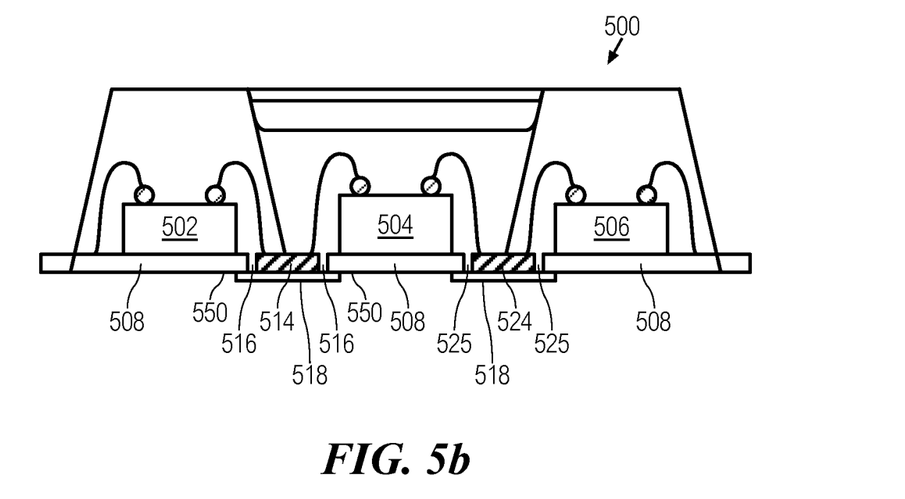
FIG. 5b is a sectional view of a semiconductor package in accordance with another embodiment of the present invention.

FIG. 5b illustrates another embodiment of the invention in which a semiconductor device, also indicated as 500, is illustrated. The embodiment of FIG. 5b is similar to the embodiment of FIG. 5a and, therefore, a full discussion of the features common to FIG. 5a and FIG. 5b is not repeated. The principal components of the semiconductor device 500 of FIG. 5b are the first, second and third dies 502, 504 and 506 all of which are disposed on respective first, second and third die pads of the lead frame 508, the first and second die interconnect portions 514, 524 of the lead frame, which are isolated from the die pads with isolation gaps 516 and 525, and first, second and third encapsulation mediums 530, 534, 532. Where the arrangement of FIG. 5b differs from that of FIG. 5a is in the provision of the insulation layer 518. In the embodiment of FIG. 5b, the insulation layer 518 does not span the entire underside of the lead frame 508, but rather is disposed only on the undersides of the first and second die interconnect portions 514, 524 and edges of the undersides 550 of the first, second and third die pads. In one embodiment, the insulation layer 518 comprises an insulative tape of a type commonly used in semiconductor packaging processes.

Figure 6A:
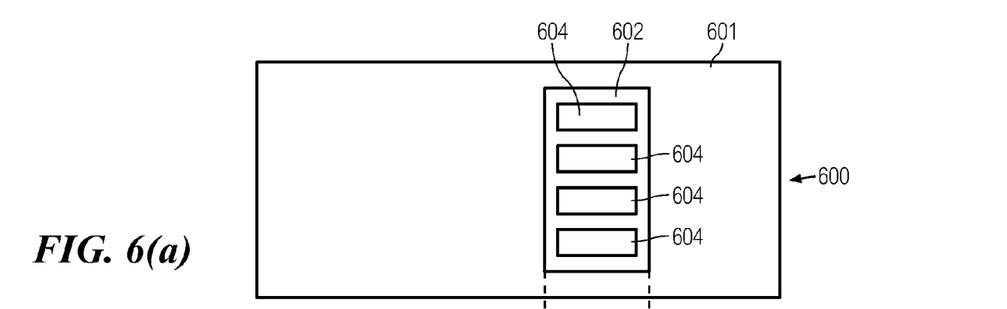
FIG. 6a illustrates a plan view of a lead frame in accordance with an embodiment of the present invention.
Figure 6B:
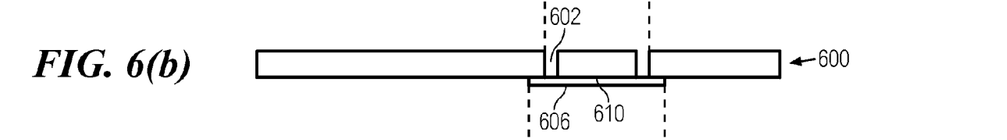
Figure 6C:
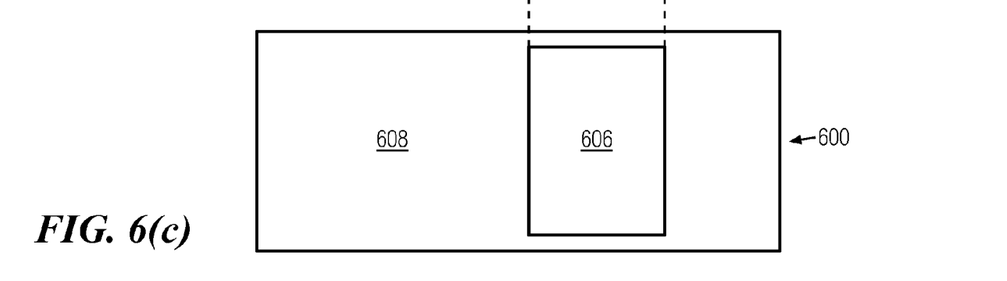

Referring now to FIG. 6 a lead frame 600 suitable for use in the embodiments of FIG. 4a and FIG. 4b is illustrated. It will be appreciated that the techniques discussed with reference to FIG. 6 may be readily extended for the preparation of a lead frame or substrate for use in the semiconductor devices 500 of FIGS. 5a and 5b.

FIG. 6a illustrates a top view of the lead frame 600. FIG. 6b illustrates a sectional view through lead frame 600 and FIG. 6c provides a view of the underside of the lead frame 600. In this embodiment, the lead frame 600 includes a die pad 601 which is, in this embodiment, the bulk part of the lead frame. Of course, it will be appreciated, that one or more die pads or pad portions may be provided. A stamping or etching operation has been performed on the lead frame 600 to remove a portion thereof as indicated by the gap 602, denoting the portion that has been removed from the lead frame 600. Disposed within the gap 602 are die interconnect portions 604, which are electrically isolated from the die pad 601 of the lead frame 600. The die interconnect portions 604 are isolated from the die pad 601 by the gap 602 surrounding the die interconnect portions 604. The die interconnect portions 604 are retained in place within the gap 602 by an insulating layer 606. The insulating layer 606 may comprise a piece of tape affixed or otherwise attached to an underside 608 of the die pad 601. The insulating layer 606 is also affixed to an underside 610 of the die interconnect portions 604.

The die interconnect portions 604 are arranged to receive first bond wires that extend from a first die and to receive second bond wires that extend from a second die such that the die interconnect portion forms an electrical connection between the first die and the second die (dies and wires not shown in FIG. 6).

In one embodiment, the or each die interconnect portion 604 is isolated from the or each die pad or pad portion 601 of the lead frame 600 by stamping out an isolation portion (not shown) previously in the volume of the lead frame denoted by 602 and locating the or each die interconnect portion on an insulation medium 606. During the stamping process, a significant portion of the isolation portion 602 is stamped out from lead frame 600. In one technique, one or more retaining parts of the isolation portion 602 are not stamped out to begin with, but are retained to form a bond with the or each die interconnect portion 604 in order to retain die interconnect portions 604 in place in the lead frame prior to the insulating medium 606 being attached to lead frame 600. In this embodiment, the insulating medium 606 is a tape affixed to the underside 608 of the lead frame 600 and underside 610 of the die interconnect portion(s) 604. Once the insulating medium 606 is in place, thereby retaining the or each die interconnect portion in place, the one or more retaining parts of the isolation portion are then removed thereby ensuring full isolation of the or each die interconnect portion 604 from die pad 601 of lead frame 600. One suitable technique for the removal of the one or more retaining parts of the isolation portion is an etching process as commonly used in the semiconductor manufacturing industry.

In another embodiment, the or each die interconnect portion 604 is isolated from the die pad 601 of lead frame 600 by etching out isolation portion 602. This etching process can be a variation or an addition to the standard etching process which may be required for the lead frame, to remove isolation portion 602.

Independently of the specific manner for removing isolation portion 602, the semiconductor package may then be subjected to a semiconductor package assembly process including: sawing, die bonding, wire bonding, and, where appropriate, encapsulation of the dies such as by gel coating and encapsulation molding as discussed above.

It will be appreciated that, in alternative embodiments, other arrangements may be provided for the insulative layer 606. For instance, lead frame 600 may be disposed upon a layer of insulative material, similar to a manner as illustrated in FIG. 4a and FIG. 5a.

Thus, significant benefits may be realized by implementation of the techniques disclosed herein with only a relatively minor redesign of the lead frame with an additional stamping or etching process to facilitate a die to die interconnection far less susceptible to bond wire breakage than is presently used to effect die to die interconnections. On the assembly manufacturing side, realization of the techniques disclosed herein involves only a minor redesign of the mould cavity.

In embodiments comprising two or more dies, such as that of FIG. 5a or FIG. 5b, the assembly process is similar. With reference to, for example, FIG. 5a, dies 502, 506 are die bonded to the die pads of the lead frame 508. Wire bonding is then effected for dies 502, 506 to form the wire bonds 512a, 512b, 528a, 528b to lead fingers of the lead frame 508 and to the die interconnect portions 514, 524. The dies 502 and 506 are then subjected to an encapsulation molding process to encapsulate the dies in a mould compound 530, 532. The die 504 is then die bonded to a die pad of the lead frame 508 before wire bonds 522a, 522b are formed to electrically connect the die 504 to the die interconnect portions 514, 524. Subsequently, the die 504 is encapsulated or coated with gel encapsulation 534 and then the lid 538 is attached.

Although the invention is described herein with reference to specific embodiments, various modifications and changes can be made without departing from the scope of the present invention as set forth in the claims below. For example, other types of encapsulation material may be provided. Indeed, the semiconductor packages may be provided with one or more of the dies provided without encapsulation material. Additionally, more than one lead frame may be used, and the or each of the or each lead frame may have more than one die pad and more than one die interconnect portion. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The invention claimed is:

1. A semiconductor device, comprising:
   a lead frame having a die interconnect portion and first and second die pads, the first and second die pads being isolated from the die interconnect portion;
   a first die attached to a first major surface of the first die pad;
   a second die attached to a first major surface of the second die pad;
   a first bond wire having a first end connected to a bond pad of the first die and a second end attached to a first portion on a first surface of the die interconnect portion;
   a second bond wire having a first end connected to a bond pad of the second die and a second end attached to a second, portion adjacent the first portion on the first surface of the die interconnect portion;
   a first medium comprising a gel within which the first die is disposed; and
   a second medium comprising a mould compound within which the second die is disposed, the first medium being different from the second medium, and wherein the first bond wire and the first portion of the first surface of the interconnect portion are entirely covered by the first medium and the second bond wire and the second portion of the first surface of the interconnect portion are entirely covered by the second medium.

2. The semiconductor device of claim 1, the die interconnect portion having been isolated from the first and second die pads by stamping out an isolation portion of the lead frame, the device further comprising an insulation medium upon which the die interconnect portion is disposed.

3. The semiconductor device of claim 1, the die interconnect portion having been isolated from the first and second die pads by etching an isolation portion from the lead frame, the device further comprising an insulation medium upon which the die interconnect portion is disposed.

4. The semiconductor device of claim 1, wherein the first medium abuts the second medium.

5. The semiconductor device of claim 1, wherein the first die comprises a sensor circuit.

6. A method of assembling a semiconductor device, comprising:
   providing a lead frame having a die interconnect portion and first and second die pads, the die interconnect portion being isolated from the first and second die pads;
   attaching a first die on a first major surface of the first die pad;
   attaching a second die on a first major surface of the second die pad;
   electrically connecting the first die with the die interconnect portion with a first bond wire by attaching a first end of the first bond wire to a bond pad of the first die and a second end of the first bond wire to a first portion on a first surface of the interconnect portion;
   electrically connecting the second die with the die interconnect portion with a second bond wire by attaching a first end of the second bond wire to a bond pad of the second die and a second end of the second bond wire to a second portion on the first surface of the interconnect portion adjacent to the first portion, thereby electrically connecting the first die and the second die by way of the die interconnect portion;
   encapsulating the first die and the first bond wire within a first medium, wherein the first medium comprises a gel; and
   encapsulating the second die and the second bond wire within a second medium comprising a mould compound that is different from the first medium, and wherein the first bond wire and the first portion of the first surface of the interconnect portion are covered entirely by the first medium and the second bond wire and the second portion of the first surface of the interconnect portion are covered entirely by the second medium.

7. The method of assembling a semiconductor device of claim 6, further comprising, prior to attaching either of the first bond wire or the second bond wire, stamping out an isolation portion of the lead frame to isolate the die interconnect portion from the first and second die pads, and disposing the die interconnect portion upon an insulation medium.

8. The method of assembling a semiconductor device of claim 6, further comprising, prior to attaching either of the first bond wire or the second bond wire, etching an isolation portion from the lead frame to isolate the die interconnect portion from the first and second die pads, and disposing the die interconnect portion upon an insulation medium.

9. The method of assembling a semiconductor device of claim 6, wherein the first medium abuts the second medium.

* * * * *